(12) United States Patent
Holzmann et al.

(10) Patent No.: US 10,996,263 B2
(45) Date of Patent: May 4, 2021

(54) FRONTEND MODULE AND FRONTEND FOR A RADIO FREQUENCY TEST DEVICE, AND METHOD FOR OPERATING A FRONTEND MODULE

(71) Applicant: Rohde & Schwarz GmbH & Co. KG, Munich (DE)

(72) Inventors: Gottfried Holzmann, Zorneding (DE); Albert Moser, Munich (DE); Peter Ludwig, Aschheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 182 days.

(21) Appl. No.: 16/203,052

(22) Filed: Nov. 28, 2018

(65) Prior Publication Data

US 2019/0257878 A1 Aug. 22, 2019

(30) Foreign Application Priority Data

Feb. 22, 2018 (EP) .................................... 18158125

(51) Int. Cl.
*G01R 31/28* (2006.01)
*H04B 17/16* (2015.01)
*H04B 17/00* (2015.01)
*H04B 17/391* (2015.01)
*H04B 1/04* (2006.01)

(52) U.S. Cl.
CPC ..... *G01R 31/2822* (2013.01); *H04B 17/0085* (2013.01); *H04B 17/16* (2015.01); *H04B 17/391* (2015.01); *H04B 1/0475* (2013.01)

(58) Field of Classification Search
CPC ................ G01R 1/206; G01R 31/2822; G01R 31/31903; G01R 31/3907; G01R 31/39108; G01R 31/31912; G01R 31/31914; G01R 31/319; G01R 31/31905; G01R 31/31907; H04B 17/0085; H04B 17/15; H04B 17/16; H04B 17/29
USPC ....................................................... 324/750.3
See application file for complete search history.

(56) References Cited

U.S. PATENT DOCUMENTS

| | | | |
|---|---|---|---|
| 8,138,778 B1 | 3/2012 | Smith | |
| 2004/0207426 A1 | 10/2004 | Tsironis | |
| 2009/0028270 A1 | 1/2009 | Chen | |
| 2009/0072838 A1 | 3/2009 | Shepherd et al. | |
| 2013/0137381 A1* | 5/2013 | Vassiliou | H04B 1/56 455/67.15 |
| 2015/0253357 A1* | 9/2015 | Olgaard | G01R 31/3025 324/750.26 |
| 2016/0212641 A1* | 7/2016 | Kong | H04B 17/0087 |

(Continued)

OTHER PUBLICATIONS

Extended European Search Report dated Aug. 21, 2018, received in corresponding EP Application No. 18158125.7, 9 pp.

*Primary Examiner* — Steven L Yeninas
(74) *Attorney, Agent, or Firm* — Shumaker & Sieffert, P.A.

(57) ABSTRACT

The present invention provides a frontend module for a modular configuration of a frontend. Each of the frontend modules is configured to achieve a configuration for combining multiple frontends. In particular, multiple signals relating to a relative small frequency range may be combined together to achieve a broadband test signal. For this purpose, radio frequency interfaces are provided in the frontend module for exchanging/distributing radio-frequency signals between the individual frontend modules.

14 Claims, 5 Drawing Sheets

(56) References Cited

U.S. PATENT DOCUMENTS

| | | | |
|---|---|---|---|
| 2016/0253252 A1* | 9/2016 | Holzmann | H04B 17/0085 |
| | | | 714/31 |
| 2016/0259700 A1* | 9/2016 | Volkmann | G06F 11/273 |
| 2017/0163358 A1* | 6/2017 | Wadell | H04B 17/0085 |
| 2017/0290013 A1 | 10/2017 | McCoy et al. | |
| 2018/0034561 A1* | 2/2018 | Foegelle | H04B 17/0087 |
| 2019/0028136 A1* | 1/2019 | Zhang | H01Q 5/50 |

* cited by examiner

FRONTEND MODULE AND FRONTEND FOR A RADIO FREQUENCY TEST DEVICE, AND METHOD FOR OPERATING A FRONTEND MODULE

TECHNICAL FIELD

The present invention relates to a frontend module for a radio-frequency test device. The present invention further relates to a frontend for a radio-frequency test device and a radio-frequency test device. Further, the present invention relates to a method for operating a frontend module of a radio-frequency test device.

TECHNICAL BACKGROUND

Although applicable in principle to any radio-frequency test device, the present invention and its underlying problem will be hereinafter described in combination with testing of wireless devices.

The use of wireless communication systems for communication between electronic devices increases continuously with the advance of high speed wireless data communication.

During development or production of devices for such communication systems it is necessary to thoroughly test the devices for compliance with communication standards and legal regulations, and for evaluating the performance and the resistance with respect to interferences.

In modern communication systems, the number of wireless devices rapidly increases. Further, the amount of data to be transferred by the wireless devices also increases. In order to deal with these requirements, modern wireless devices may use a huge number of frequency bands in a wide frequency range.

Therefore, test devices for testing modern wireless communication devices also have to deal with an increasing broad frequency range. However, generating and analyzing broad frequency ranges by a single testing device is a major challenge.

SUMMARY OF THE INVENTION

Against this background, the present invention aims to provide a frontend module and a test device with a frontend which can deal with test signals covering a broad frequency range.

The present disclosure therefore provides a frontend module with a frontend for a radio-frequency test device, a radio-frequency test device and a method for operating the frontend module as described in more detail below.

According to a first aspect, a frontend module for a frontend of a radio-frequency test device is provided. The frontend module comprises a first radio frequency interface, a second radio frequency interface, a third radio frequency interface and a fourth radio frequency interface. The frontend may further comprise a signal distribution device. The first radio frequency interface is adapted to connect the frontend module with a signal generator and/or a receiving device. The second radio frequency interface is adapted to connect the frontend module with a device under test. The third radio frequency interface is adapted to connect the frontend module with a first further frontend module. The fourth radio frequency interface is adapted to connect the frontend module with a second further frontend module. The signal distribution device is adapted to selectively couple the first radio frequency interface, the second radio frequency interface, the third radio frequency interface and the fourth radio frequency interface with each other.

According to a second aspect, a frontend for a radio-frequency test device is provided. The frontend comprises at least two frontend modules according to the first aspect of the present invention, wherein the third radio frequency interface of a first frontend module is coupled with the fourth radio frequency interface of a second frontend module.

According to a third aspect, a radio-frequency test device is provided. The radio-frequency test device comprises a frontend according to the second aspect, at least one signal generator and/or at least one receiving device. Each of the at least one signal generators is adapted to provide radio-frequency signals to a first radio frequency interface of a frontend module. Each of the at least one receiving devices is adapted to receive radio-frequency signals provided by a first radio frequency interface of a frontend module.

According to a fourth aspect, a method for operating a frontend module is provided. The frontend module may comprise a first radio frequency interface adapted to connect the frontend module with a signal generator and/or a receiving device, a second radio frequency interface adapted to connect the frontend module with a device under test, a third radio frequency interface adapted to connect the frontend module with a first further frontend module and a fourth radio frequency interface adapted to connect the frontend module with a second further frontend module. The method comprises at least one of the following steps: providing a signal received by the first radio frequency interface to the second radio frequency interface and/or the third radio frequency interface, providing a signal received by the fourth radio frequency interface to the second radio frequency interface and/or the third radio frequency interface, providing a signal received by the second radio frequency interface to the first radio frequency interface and/or the fourth radio frequency interface, and providing a signal received by the third radio frequency interface to the first radio frequency interface and/or the fourth radio frequency interface.

The present invention is based on the fact that radio-frequency test devices, in particular wireless communication devices, are operated in an increasing frequency range. As already explained above, testing such radio-frequency test device requires covering the whole frequency range of the device. However, manufacturing signal generators covering a wide frequency range and receiving devices covering a wide frequency range is very difficult. Moreover, components for manufacturing broadband devices are very expensive, which leads to high costs for such covering devices covering a wide frequency range.

The present invention therefore provides a modular frontend for a radio-frequency test device. In particular, it is an idea of the present invention to provide frontend modules which can be connected with multiple signal generators and/or receiving devices, each signal generator and receiving device only dealing with a narrow frequency range. The frontend modules according to the present invention can provide flexible signal paths for combining radio-frequency signals from multiple signal generators and/or providing a broadband signal from a device under test to multiple receiving devices. Accordingly, each signal generator and receiving device may cover only a small frequency range which relates only to a part of the wide frequency range covered by the device under test. Accordingly, each signal generator and receiving device can be configured to a desired predetermined frequency range. Thus, the costs for such signal generators and receiving devices are relative lower. Furthermore, the accuracy of such signal generators and receiving devices operating in a narrow frequency range usually is more precise than the accuracy of a broadband device operating in a wide frequency range.

By using a modular concept for building a frontend based on multiple frontend modules, it is possible to adapt the frontend for multiple use cases in a very flexible manner. In particular, a number of frontend modules can be adapted depending on a desired frequency range and thus, the required number of signal generators and/or receiving devices can be selected accordingly. Accordingly, by using a higher number of frontend modules, it is possible to extend the frontend very easily. Thus, the frequency range of a test signal provided to a device under test can be easily increased by using a higher number of frontend modules and connecting multiple signal generators to the respective frontend modules. Accordingly, a test signal received from a device under test can be also provided to multiple receiving devices, wherein the number of receiving devices may be easily increased by increasing the number of frontend modules.

The first to the fourth radio frequency interface of the frontend module may be any kind of appropriate interface for connecting the respective devices. For example, the radio frequency interfaces may comprise a plug or socket for connecting a corresponding plug or socket of a cable. For example, the radio frequency interfaces may provide a connector for connecting a coaxial cable, a waveguide or the like. However, it is understood, that any other medium for carrying radio-frequency signals to/from the respective interface may be possible, too.

Furthermore, it may be also possible that the respective radio frequency interface provides a connector for directly connecting a corresponding connector of a further device. For example, a connector of the third or the fourth radio frequency interface may be directly connected to a corresponding connector of an interface of a further frontend module. Thus, it may be possible to provide connection between adjacent frontend modules without any intermediate elements like cables etc.

It may be also possible that at least some of the radio frequency interfaces may be connected with a specialized element for connecting a frontend module with a further device, in particular with a signal generator, a receiving device or a further frontend module. For example, one or more frontend modules according to the present invention may be installed in a common housing. For example, an appropriate connection system for connecting the frontend modules with the signal generators and/or the receiving devices may be used. Accordingly, such a connection system may also provide corresponding connectors adapted to the respective interfaces of the frontend module.

The individual interfaces of the frontend module may be placed at any appropriate position, in particular at any appropriate side of the frontend module. For example, it may be possible that all interfaces are placed at a same sidewall of the frontend module. Furthermore, it may be possible that all interfaces are arranged at different sidewalls of the frontend module. Furthermore, it may be also possible that for example the second radio frequency interface module for connecting the device under test may be arranged at another sidewall than the remaining interfaces. For example, the first, the third and the fourth radio frequency interface module may be located at a side opposite to the side with the second radio frequency interface. However, it is understood that any other arrangement for the radio frequency interfaces is possible, too. For example, the third and the fourth radio frequency interfaces may be arranged at opposite sides of the frontend module.

Further to the connectors for connecting the respective radio frequency interface with an external device, each radio frequency interface may also provide an appropriate connection for internal connections. In particular, each of the radio frequency interfaces may be connected with the signal distribution device of the frontend module. For this purpose, appropriate wires or waveguides may be used for connecting the radio frequency interfaces with the signal distribution device of the frontend module. For example, plugs may be used for connecting the radio frequency interfaces and the signal distribution device. However, it is understood, that any other appropriate method for connecting the radio frequency interfaces and the signal distribution device may be also possible. For example, the radio frequency interfaces and the signal distribution device may be also connected by a soldered connection or the like.

The signal distribution device of the frontend module may comprise any kind of appropriate switches for providing switched connections between the individual interfaces. In particular, any kind of signal distribution device which is appropriate for switching high frequency signals may be used for switching the connections within the signal distribution device. For example, switching elements on the basis of silicon or the like may be used. A signal distribution device further may comprise any appropriate other element for providing switchable connections between the individual interfaces.

Furthermore, the signal distribution device may also comprise further elements such as combiners, circulators, dividers, filters, etc.

The switching of the signal distribution device may be controlled, for example based on an electronic signaling. For example, the switching may be controlled based on instructions provided by a controller, in particular a controller comprising a processor and a memory for providing instructions to be carried out by the respective processor.

Furthermore, the switching of the signal distribution device may be also based on an automatic switching. For example, the switching operations of the signal distribution device may be based on a detection of a signal on a respective radio frequency interface. For example, the signal distribution device may automatically provide a connection between two radio frequency interfaces upon detecting a signal on one of the radio frequency interfaces. Furthermore, an automatically switching may be also based, for example based on a detected plug or the like on a terminal of the radio frequency interface. Accordingly, if a signal or a plug is detected on a radio frequency interface, the signal distribution device may automatically provide a connection between the respective radio frequency interface and a further radio frequency interface on which the signal should be provided.

It is understood, that any other scheme for manually or automatically switching the connections between the individual radio frequency interfaces may be also possible.

Further embodiments of the present invention are subject of the further sub-claims and of the following description, referring to the drawings.

In a possible embodiment, the signal distribution device may be adapted to provide a signal received by the first radio frequency interface to the second radio frequency interface and/or the third radio frequency interface. The signal distribution device may further provide a signal received by the fourth radio frequency interface to the second radio frequency interface and/or the third radio frequency interface.

The signal distribution device may be further adapted to provide a signal received by the second radio frequency interface to the first radio frequency interface and/or the fourth radio frequency interface. The signal distribution device may be further adapted to provide a signal received by the third radio frequency interface to the first radio frequency interface and/or the fourth radio frequency interface.

Accordingly, signals received from a signal generator which is connected to the first radio frequency interface may be provided to the second radio frequency interface which can be connected to the device under test. Furthermore, the signal from the signal generator can be also forwarded from the first radio frequency interface to a further frontend module connected to the third radio frequency interface. Furthermore, a signal received by a fourth radio frequency interface which may be provided, for example from a further frontend module, may be forwarded to the second radio frequency interface which can be connected to the device under test. Additionally or alternatively, the signal provided from a first further frontend module may be also provided to a second further frontend module connected on the third radio frequency interface. In this way, transmission signals/uplink signals can be very flexibly transmitted between the individual radio frequency interfaces of the frontend module.

Furthermore, it may be also possible to provide reception/downlink signals in a similar manner. For example, a signal received from a device under test at the second radio frequency interface may be provided to a receiving device on the first radio frequency interface. Additionally or alternatively, the signal from the device under test may be also forwarded from the second radio frequency interface to the fourth radio frequency interface to be forwarded to a further frontend module. Furthermore, it may be also possible to provide transmission/downlink signals from the third radio frequency interface, connected with another frontend module, to the reception device connected on the first radio frequency interface. Additionally or alternatively, the signal may be also provided to another frontend module connected on the fourth radio frequency interface.

In this way, it is possible to provide a very flexible method for exchanging radio-frequency signals between the device under test and the signal generator/receiving device and further to other frontend modules. In particular, by exchanging radio-frequency signals between connected frontend modules, it is possible to provide a very flexible and extendable configuration for distributing the radio-frequency signals.

In a possible embodiment, the second radio frequency interface may comprise a bidirectional external terminal. The bidirectional external terminal may be adapted to receive radio-frequency signals from the device under test and to provide radio-frequency signals to the device under test.

The bidirectional external terminal may be configured, for example as a single connector for connecting the device under test. For example the connector may be a coaxial plug or socket. However, it is understood that any other appropriate connector for connecting a corresponding connector may be also possible. For example, the device under test may be directly connected to the external terminal of the second radio frequency interface. Furthermore, the device under test may be also connected to the external terminal of the second radio frequency interface by means of a cable or another waveguide or the like. Accordingly, the same terminal of the second radio frequency interface may be used for transmitting and receiving uplink/downlink signals.

In a possible embodiment, the second radio frequency interface may comprise a circulator. The circulator may comprise at least three ports. In particular, a signal received by a first port of the circulator may be forwarded to a second port of the circulator, and a signal received by the second port may be forwarded to a third port of the circulator. In this way, it may be possible to separate radio-frequency signals depending on their propagation direction. In particular, it may be possible to receive a signal on a first internal port of the respective radio frequency interface and to forward the received signal to an output port, wherein a signal received by the output port is provided to another internal input port of the respective radio frequency interface. Thus, such a radio frequency interface may provide separate internal ports for separate propagation directions, whereby a common output port is used for transmission and reception of a signal.

In a possible embodiment, the circulator may comprise a single external terminal, a first internal terminal and a second internal terminal. The circulator may be adapted to provide radio-frequency signals received from the signal distribution device on a first internal terminal to the bidirectional external terminal. The circulator may be further adapted to provide radio-frequency signals received on the bidirectional external terminal to a second internal terminal. Accordingly, one single external terminal can be used for connecting a device under test, and at the same time a separate internal transmission line can be used for distributing and switching the signals depending on their propagation direction.

In a possible embodiment, the second radio frequency interface may comprise an external input terminal adapted to receive signals from the device under test. Additionally or alternatively, the second radio frequency interface may comprise an external output terminal adapted to provide signals to the device under test. Accordingly, different terminals, and thus different connectors are provided for radio-frequency signals depending on their direction. In particular, different terminals are provided for uplink signals and downlink signals.

In a possible embodiment, the first radio frequency interface may comprise at least two input terminals. Each input terminal may be adapted to receive signals from a signal generator. By providing a number of two and more input terminals for the first radio frequency interface, it is possible to connect multiple signal generators to the respective radio frequency interface. In particular, it may be possible that each input terminal of the first radio frequency interface may receive signals relating to different channels and/or frequency bands. Thus, multiple signals may be provided to a common radio frequency interface.

In a possible embodiment, the signal distribution device may be adapted to separately provide each signal received by an input terminal of the first radio frequency interface to the second radio frequency interface. The signal distribution device may additionally or alternatively also provide the signals received by the input terminals of the first radio frequency interface separately to the third radio frequency interface. In particular, it may be possible that one or some of the radio-frequency signals received by the first radio frequency interface may be provided to the second radio frequency interface connected to the device under test, and other radio-frequency signals provided at other terminals of the first radio frequency interface may be provided to the third radio frequency interface. Thus, a very flexible distribution of the radio-frequency signals provided at the first radio frequency interface can be achieved.

In a possible embodiment, the signal distribution device may comprise a combiner. The combiner may be adapted to combine radio-frequency signals received by the first radio frequency interface and the fourth radio frequency interface. Furthermore, the combiner may also combine multiple signals received by separate terminals of the first radio frequency interface. Accordingly, it is possible to combine multiple radio-frequency signals to a common signal and to forward the combined signal to the device under test and/or a further frontend module. Any kind of appropriate combiner can be used for combining the radio frequency signals.

In a possible embodiment, the signal distribution device may comprise a splitter. The splitter may be adapted to split a signal received by the second radio frequency interface to at least two signals and to provide the split signals to the first radio frequency interface and the fourth radio frequency interface. Accordingly, by splitting the radio-frequency signal to multiple signals, it is possible to provide this signal to multiple terminals, in particular to multiple radio frequency interfaces. For this purpose, any appropriate device which can split a radio-frequency signal to at least two signal paths can be used.

In a possible embodiment of the radio-frequency test device, the radio-frequency test device may comprise a radio frequency splitter adapted to split a radio-frequency signal provided by the device under test and to provide the split radio-frequency signal to multiple second radio frequency interfaces of at least two frontend modules. Accordingly, a same radio-frequency signal of the device under test may be provided to multiple interfaces of different frontend modules. Thus, each frontend module can receive the output/downlink signal of the device under test. For this purpose, a same split signal may be provided to each second radio frequency interface of the frontend modules. Furthermore, it may be also possible to apply a filtering of the split signal. In this way, output signals relating to different channels or frequency ranges may be provided to the respective frontend modules.

In a possible embodiment, the radio-frequency test device may further comprise a radio frequency combiner. The radio frequency combiner may be adapted to combine radio-frequency signals provided by radio frequency interfaces of at least two frontend modules, and to provide the combined radio-frequency signals to a device under test. Accordingly, by combining radio-frequency signals provided by at least two radio frequency interfaces of different frontend modules, a transmission/uplink signal may be generated comprising signals, channels for frequency ranges of all the provided radio-frequency signals.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
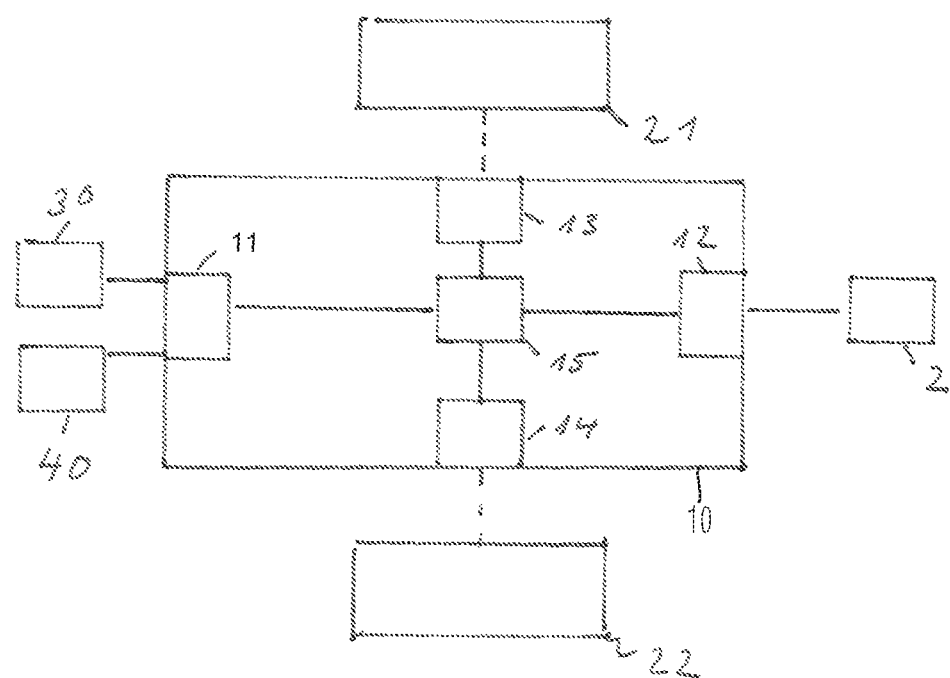
FIG. 1 shows a block diagram of an embodiment of frontend module according to the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of an embodiment of a frontend module 10 of a radio-frequency test device. The frontend module 10 comprises a first radio frequency interface 11, a second radio frequency interface 12, a third radio frequency interface 13 and a fourth radio frequency interface 14. Further, the frontend module 10 comprises a signal distribution device 15. The first radio frequency interface 11 may be coupled with a signal generator 30. For example, signal generator 30 may provide a radio-frequency signal for testing a device under test 2. The signal provided by signal generator 30 may comprise for example radio-frequency signals within a predetermined frequency range or relating to a number of one or more predetermined frequency channels. Signal generator 30 may be connected to the first radio frequency interface 11, for example, by a pluggable connection. For example, the first radio frequency interface 11 may provide a number of one or more external terminals for connecting the first radio frequency interface 11 with one or more signal generators 30. In case more than one signals are provided to the first radio frequency interface 11 separately, separate input terminals may be provided. Further, the first radio frequency interface 11 may comprise at least one output terminal. Accordingly, a receiving device 40 may be connected to the first radio frequency interface 11. The receiving device 40 may be also connected to the first radio frequency interface 11 by means of a pluggable connection.

Even though signal generator 30 and receiving device 40 are illustrated as a separate devices, it may be also possible to combine the signal generator 30 and receiving device 40 in a single device for providing radio-frequency signals and receiving radio-frequency signals. Furthermore, signal generator 30 and receiving device 40 may be communicatively coupled in order to synchronize the respective devices. For example, receiving device 40 may control the output of signal generator 30, or signal generator 30 may provide information about the output signals to receiving device 40. However, it is understood that any other appropriate synchronization between the signal generator 30 and the receiving device 40 may be also possible. Furthermore, if more than one signal generator 30 or more than one receiving device 40 is used, the multiple signal generators 30/receiving devices 40 may be also synchronized with each other.

The second radio frequency interface 12 may comprise at least one terminal for connecting a device under test 2. For example, the output terminal of the second radio frequency interface 12 may be a pluggable connection for connecting a cable or another appropriate waveguide. Furthermore, the device under test 2 may be directly connected to the output terminal of the second radio frequency interface 12. In particular, a single external terminal may be used for providing test signals from the second radio frequency interface 12 to the device under test 2 and for receiving the output signals of the device under test 2 at the terminal of the second radio frequency interface 12. However, it may be also possible to provide separate external terminals for providing test signals from the second radio frequency interface 12 to the device under test 2 and for receiving output signals from the device under test 2 at another terminal of the second radio frequency interface 12.

Furthermore, the frontend module 10 may comprise a third radio frequency interface 13 for connecting the frontend module 10 with a first further frontend module 21. In particular, the third radio frequency interface 13 may be connected with a corresponding radio frequency interface of the first further frontend module 21. In particular, the third radio frequency interface 13 may comprise one or more connectors for directly connecting a connector of a corresponding interface of the first further frontend module 21. Alternatively, it may be also possible to connect the third radio frequency interface 13 with a corresponding radio frequency interface of the first further frontend module 21 by means of one or more cables or other waveguides.

Furthermore, the fourth radio frequency interface 14 may provide a connection for connecting a second further frontend module 22. As already mentioned above in connection with the third radio frequency interface, the fourth radio frequency interface 14 may also comprise connectors like plugs or sockets for directly connecting the corresponding radio frequency interface of the second further frontend module 22. Furthermore, it may be also possible to use a cable or another waveguide for connecting the fourth radio frequency interface 14 with a corresponding radio frequency interface of the second further frontend module 22.

The first, second, third and fourth radio frequency interfaces 11, 12, 13, 14 may further comprise internal connectors for providing and/or receiving signals. Accordingly, the signal distribution device 15 of the frontend module 10 may be connected to each of the first, second, third and fourth radio frequency interface 11, 12, 13, 14. The signal distribution device 15 may provide switchable connections between the individual radio frequency interfaces 11-14. For example, a signal provided by a signal generator 30 at the first radio frequency interface 11 may be transmitted through the signal distribution device 15 to the second radio frequency interface 12 for providing the signal to the device under test 2. Furthermore, the signal from the signal generator 30 may be additionally or alternatively forwarded from the first radio frequency interface 11 to the third radio frequency interface 13. Thus, the respective signal may be forwarded to the first further frontend module 21 through the third radio frequency interface 13.

Furthermore, a radio-frequency signal may be received by the fourth radio frequency interface 14 and forwarded through the signal distribution device 15 to the second radio frequency interface 12 for providing the signal to the device under test 2. Additionally or alternatively, the radio-frequency signal received by the fourth radio frequency interface 14 may be forwarded through the signal distribution device 15 to the third radio frequency interface 13 for forwarding the signal to the first further frontend module 21. In this way, transmission/uplink signals may be distributed through the frontend module 10.

Furthermore, received signals/downlink signals may be also distributed through the frontend module 10 by means of the signal distribution device 15. For example, a signal from the device under test 2 which is received by the second radio frequency interface 12 may be forwarded to the first radio frequency interface 11 for providing the signal to a receiving device 40. Additionally or alternatively, the signal from the device under test 2 received by the second radio frequency interface 12 may be forwarded to the third radio frequency interface 13 for forwarding the signal to the first further frontend module 21.

Furthermore, a signal from a second further frontend module 22 may be received by the fourth radio frequency interface 14 and forwarded by the signal distribution device 15 to the first radio frequency interface 11 and/or to the third radio frequency interface 13.

Figure 2:
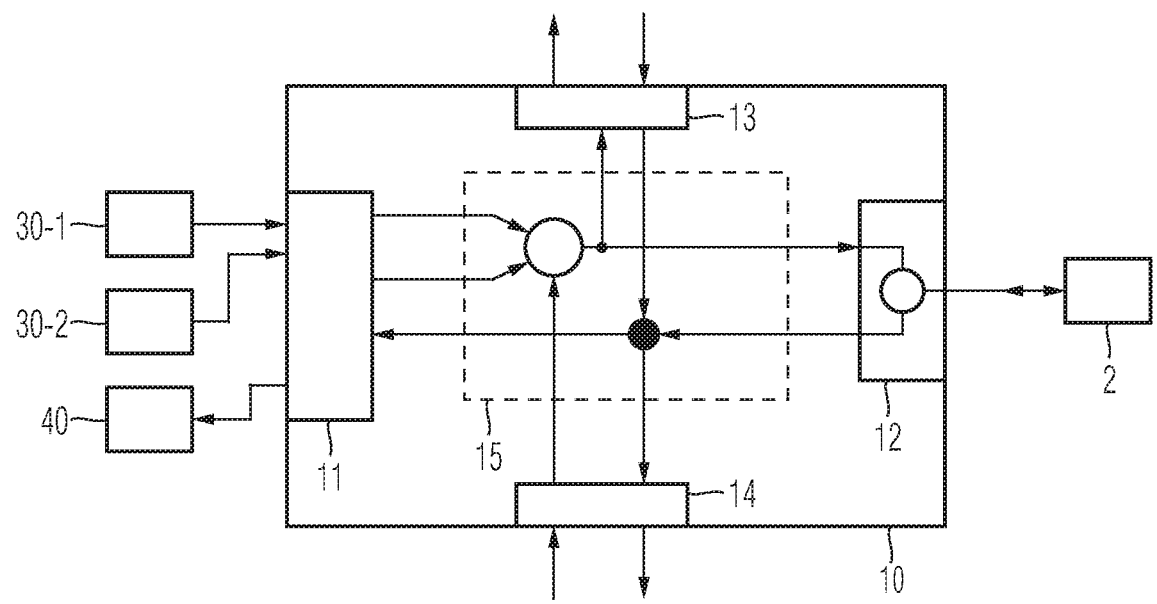
FIG. 2 shows a block diagram of another embodiment of a test arrangement according to the present invention.

FIG. 2 shows a block diagram of another embodiment of a frontend module 10 according to an embodiment. The embodiment shown in FIG. 2 mainly corresponds to the embodiment further described in connection with FIG. 1. Thus, the description of FIG. 1 also applies to the embodiment of FIG. 2 as far as possible.

The embodiment in FIG. 2 further shows a number of more than one signal generator 31-1, 31-2 connected to the first radio frequency interface 11. In particular, each signal generator 31-$i$ may provide a radio-frequency signal relating to a different frequency, frequency range or channel. Thus, multiple radio-frequency signals relating to different frequencies or channels may be provided to the first radio frequency interface 11. The multiple radio-frequency signals received by the first radio frequency interface 11 may be combined to a single signal within the first radio frequency interface 11. Furthermore, it may be also possible that the first radio frequency interface 11 may provide the received signals separately to the signal distribution device 15. Signal distribution device 15 may also receive a further radio-frequency signal from the fourth radio frequency interface 14. Thus, the single signal or the multiple signals received from the first radio frequency interface 11 and the further radio-frequency signal received from the fourth radio frequency interface 14 may be combined to a single radio-frequency signal. The combined radio-frequency signal may be provided by the signal distribution device 15 to the second radio frequency interface 12 and/or the third radio frequency interface 13.

Furthermore, a radio-frequency signal from the device under test 2 may be received by the second radio frequency interface 12 and provided to the signal distribution device 15. Signal distribution device 15 may split the signal received from the second radio frequency interface 12 and provide the split signals to the first radio frequency interface 11 and/or to the fourth radio frequency interface 14. It is understood, that any appropriate device for combining radio-frequency signals in the signal distribution device 15 and the first radio frequency interface 11 may be used. Accordingly, any appropriate device for splitting radio-frequency signals to two channels may be also used in the signal distribution device 15.

Furthermore, the second radio frequency interface 12 may provide separate terminals for outputting the radio-frequency signal to the device under test 2 and for receiving radio-frequency signals form the device under test 2. Alternatively, the second radio frequency interface 12 may have only a single terminal for outputting radio-frequency signals and receiving radio-frequency signals. Such a bidirectional terminal may reduce the number of required connectors for connecting the device under test 2 with the second radio frequency interface 12. In case only a single bidirectional terminal is provided for receiving and outputting radio-frequency signals at the second radio frequency interface 12, the second radio frequency interface 12 may comprise a separating device such as a circulator. The circulator may comprise at least three ports. A signal received by a first port of the circulator may be output at a second port. A signal received by the second port of the circulator may be output to the third port. Accordingly, the second port of such a circulator may be connected to the bidirectional output terminal of the second radio frequency interface 12, and the first and the third port may be connected to the signal distribution device 15. In this way, the transmitted and the received signals at the bidirectional output terminal may be separated depending on their propagation direction and provided to separate terminals within the frontend module 10. Thus, the signal distribution device 15 may provide a separate switching for the input and the output signal of the device under test 2.

Figure 3:
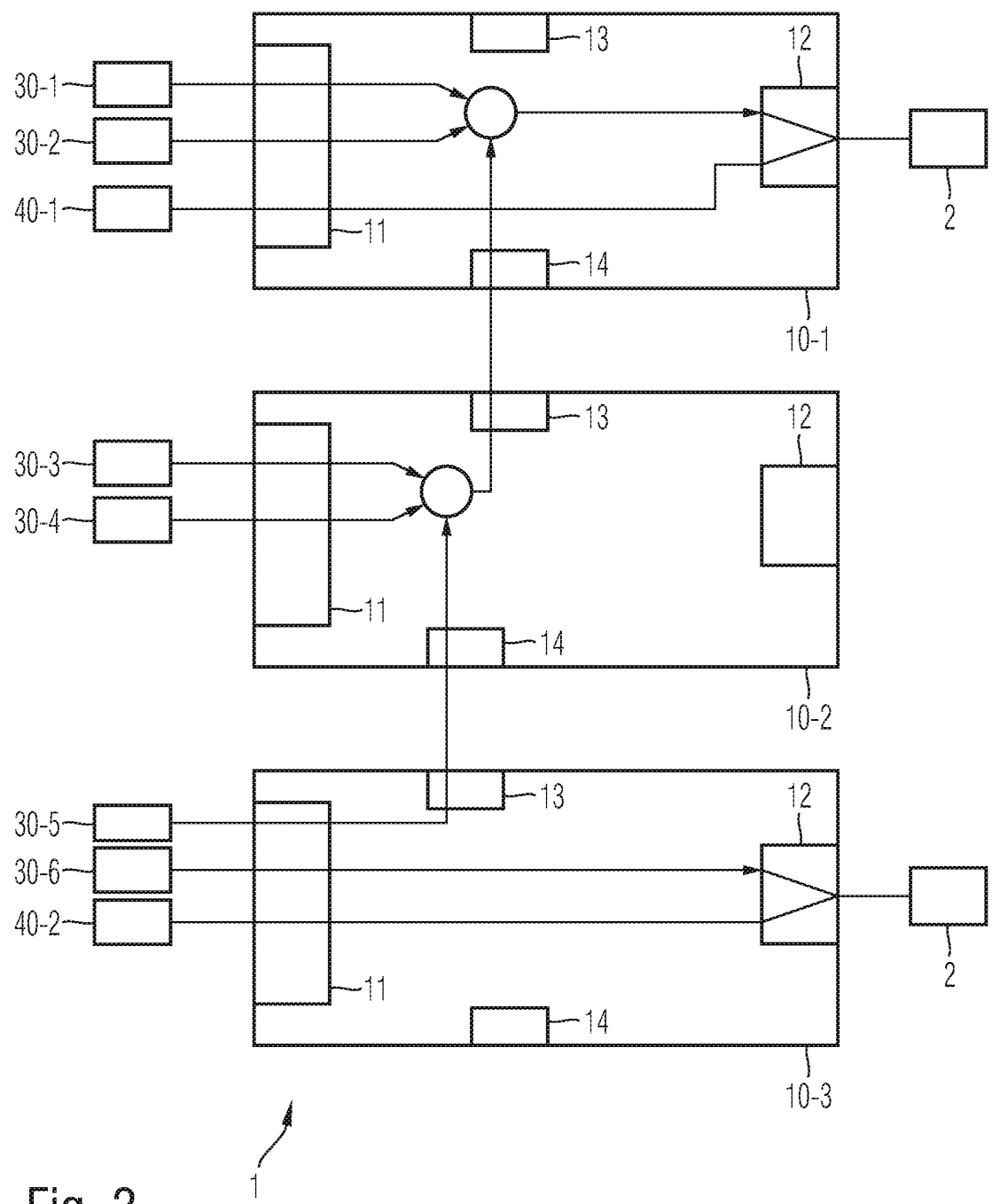
FIG. 3 shows a block diagram of a frontend according to the present invention.

FIG. 3 shows a block diagram of an embodiment of a frontend 1 comprising multiple frontend modules 10. Even though the embodiment of FIG. 3 shows a configuration comprising three frontend modules 10, the present invention is not limited to frontends comprising only three frontend modules. Furthermore, any number of one, two or more frontend modules 10 can be applied for realizing an appropriate frontend. Each of the frontend modules 10 in FIG. 3 may be a frontend module 10 as described above. Thus, the respective description of the previous embodiments also applies to the frontend modules 10 in this embodiment and is not repeated herein.

As can be seen in FIG. 3, each first radio frequency interface 11 may receive a number of one or more radio-frequency signals from signal generators 30-$i$. In particular, each signal generator 30-$i$ may provide a signal relating to a predetermined frequency, frequency range or one or more predetermined frequency channels. In particular, each signal generator 30-$i$ may provide signals relating to different frequencies, frequency ranges or channels. Thus, the configuration of the respective signal generators may be adapted to the respective frequency range.

Furthermore, one or more receiving devices 40-$i$ may be connected to a first radio frequency interface 11 of a frontend module 10. The individual frontend modules 10 may be connected with each other through the third and the fourth radio frequency interfaces 13, 14. Thus, it is possible to provide radio-frequency signals received by a first radio frequency interface 11 of a first frontend module 10 to another frontend module 10 through the third and the fourth radio frequency interface 13, 14. After combining all the radio-frequency signals received by the first radio frequency interface 11 of one or more frontend modules 10, the combined signal can be provided to a device under test 2 through a second radio frequency interface 12. Accordingly, it may be also possible to receive signals from a device under test 2 by the second radio frequency interface 12 of a frontend module 10 and forward the received signal to one or more receiving devices 40 connected at the first radio frequency interface 11 of one or more first radio frequency interfaces 11.

As further shown in FIG. 3, it is even possible to connect multiple devices under test 2 at a frontend comprising multiple frontend modules 10. In this case it is even possible to provide each of the devices under test 2 with separate signals and to forward the output of the devices under test 2 to appropriate receiving devices 40 depending on the configuration of the respective signal distribution devices 15.

In particular, the configuration of the respective signal distribution device 15 may be controlled manually depending on a user input. Alternatively, it may also possible to control the configuration of the signal distribution 15 automatically. For example, a received signal may be identified and a switching of the signal distribution device 15 may be automatically configured depending on a detected signal. Furthermore, it may be also possible to identify a connection of a plug or a socket at a terminal of one of the radio frequency interfaces 11-14 and to adapt the configuration of the signal distribution device 15 depending on an identified connection. However, it is understood that any other manual or automatic configuration of the signal distribution device 15 may be also possible.

Figure 4:
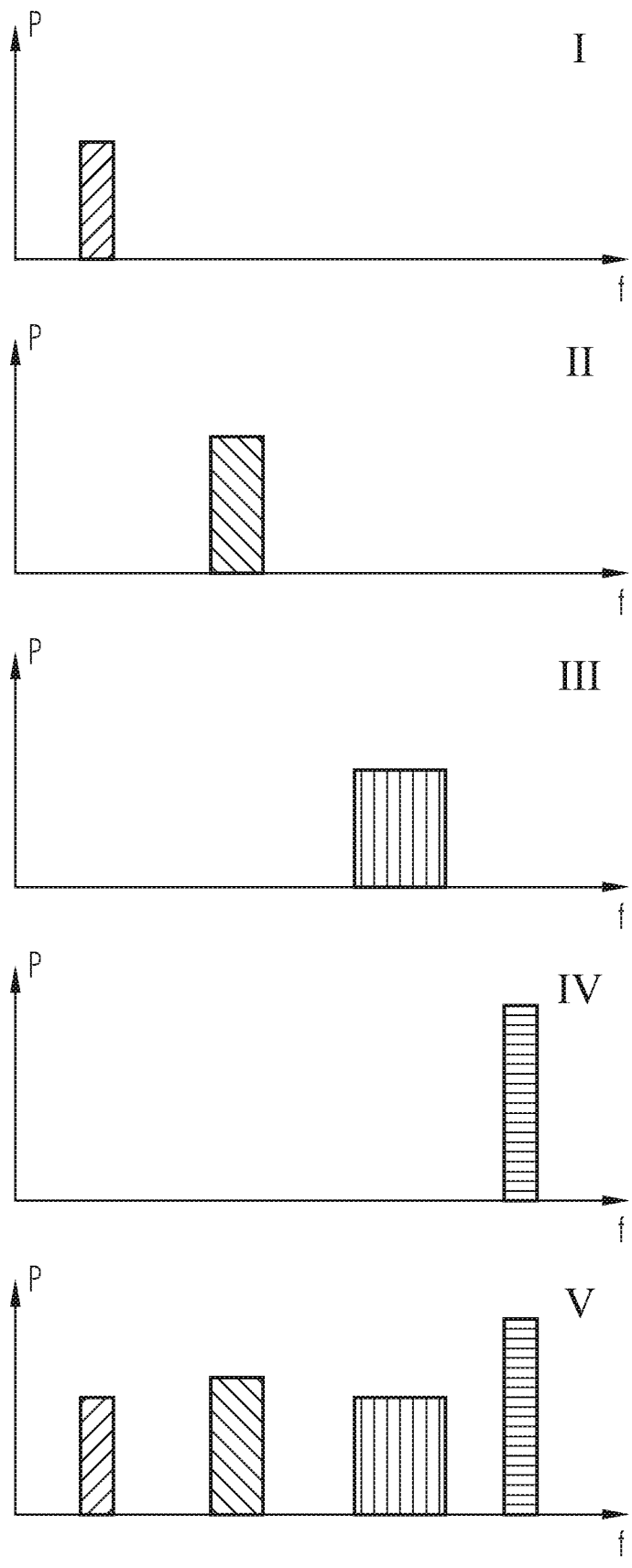
FIG. 4 shows an example for combining multiple signals according to the present invention.

FIG. 4 shows a diagram illustrating a signal distribution of multiple signals provided at input terminals of first radio frequency interfaces 11. For example, a first radio-frequency signal may be provided at a first input terminal of the first radio frequency interface 11 as shown in the diagram I of FIG. 4. A second radio-frequency signal may be provided at a second terminal of the first radio frequency interface 11 of the same frontend module 10 as shown in the diagram of II. Furthermore, a third radio-frequency signal may be provided at a first input terminal of a first radio frequency interface 11 of another frontend module 10 as shown in the diagram III and a first radio-frequency signal may be provided at a second terminal of a first radio frequency interface 11 of the further frontend module 10 as shown in the diagram IV.

As can be seen in these diagrams I-IV, each radio-frequency signal relates to another frequency range.

Accordingly, a frontend 1 comprising at least two frontend modules 10 may be configured in such a way that all these four radio-frequency signals may be combined together and a combined radio-frequency signal may be output at a second radio frequency interface 12 of one of the frontend modules 10. In this way, the device under test 2 may be provided with a radio-frequency signal comprising frequencies covered by all the four above described signals provided by separate signal generators 30.

In this way, it is possible to provide a broadband radio-frequency signal to the device under test 2 even though each of the signal generators 30 only provide a narrowband radio-frequency signal.

Figure 5:
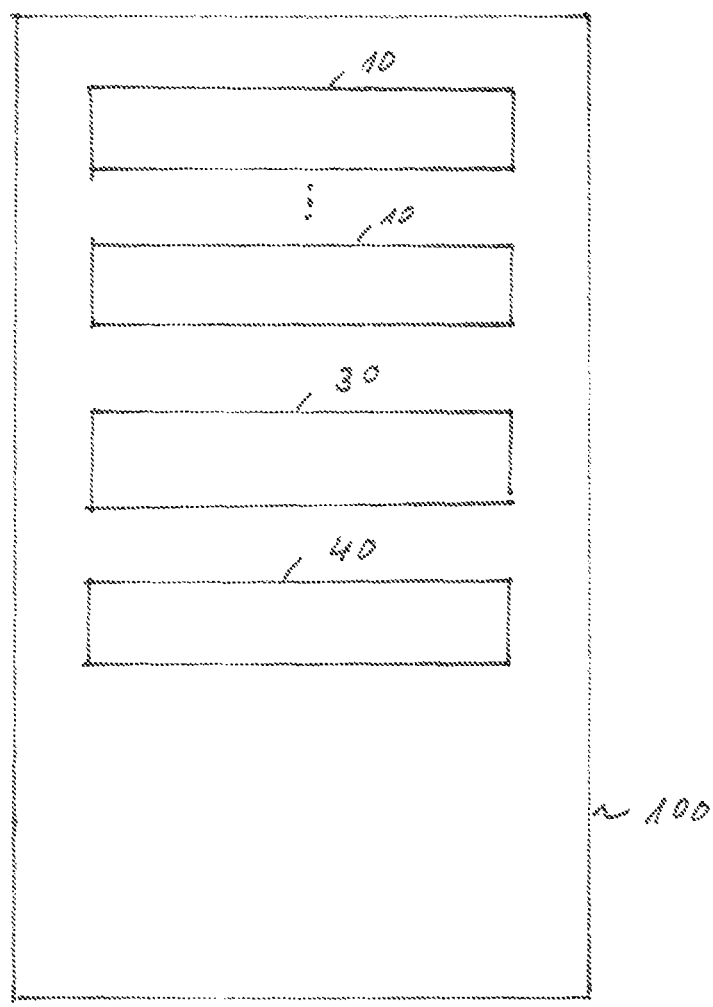
FIG. 5 shows an exemplary embodiment of a test device according to the present invention.

FIG. 5 shows a configuration of a radio-frequency test device 100 according to an embodiment. As illustrated in this configuration, the test device 100 comprises multiple frontend modules 10, a number of one or more signal generators 30 and a number of one or more receiving devices 40. Even only two frontend modules 10, a single signal generator 30 and a single receiving device 40 are shown in this embodiment, the present invention is not limited to such a configuration. Moreover, any appropriate number of frontend modules 10, signal generators 30 and receiving devices 40 is possible. By arranging all the signal generators 30, receiving devices 40 and frontend modules 10 together in a common housing, a very efficient configuration can be achieved requiring only small space. Furthermore, the individual elements can be arranged very close together. Thus, the losses and interferences can be reduced.

Figure 6:
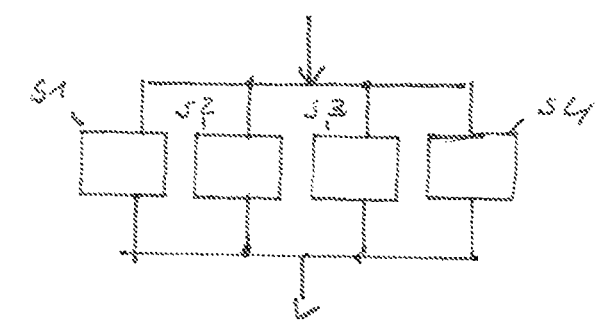
FIG. 6 shows a flow diagram of an embodiment of a method according to the present invention.

FIG. 6 shows a flow diagram of a method for operating a frontend module according to an embodiment. The frontend module 10 operated by this method may be, for example a frontend module as described above. Thus, the further description of such a frontend module is omitted herewith.

The method may comprise at least one of the following steps:

providing (S1) a signal received by the first radio frequency interface 11 to the second radio frequency interface 12 and/or the third radio frequency interface 13;

providing (S2) a signal received by the fourth radio frequency interface 14 to the second radio frequency interface 12 and/or the third radio frequency interface 13;

providing (S3) a signal received by the second radio frequency interface 12 to the first radio frequency interface 11 and/or the fourth radio frequency interface 14;

providing (S4) a signal received by the third radio frequency interface 13 to the first radio frequency interface 11 and/or the fourth radio frequency interface 14.

However, it is understood, that even more than one of the above identified steps may be performed together.

Summarizing, the present invention relates to a frontend module for a modular configuration of a frontend. Each of the frontend modules is configured to achieve a configuration for combining multiple frontends. In particular, multiple signals relating to a relative small frequency range may be combined together to achieve a broadband test signal. For this purpose, radio frequency interfaces are provided in the frontend module for exchanging/distributing radio-frequency signals between the individual frontend modules.

In particular, the present invention provides frontend modules for configuring a frontend of a radio-frequency test device comprising a first radio frequency interface which can be connected with the signal generator and/or a receiving device, a second radio frequency interface which can be connected with the device under test, and a third and a fourth radio frequency interface for connecting multiple frontend modules with each other.

What we claim is:

1. A frontend for a radio frequency test device, the frontend comprising at least two frontend modules, each frontend module comprising:
a first radio frequency interface adapted to connect each respective frontend module with at least one of a signal generator and a receiving device;
a second radio frequency interface adapted to connect each respective frontend module with a device under test;
a third radio frequency interface adapted to connect each respective frontend module of the at least two frontend modules with a first further frontend module;
a fourth radio frequency interface adapted to connect each respective frontend module of the at least two frontend modules with a second further frontend module; and
a signal distribution device adapted to selectively couple the first radio frequency interface, the second radio frequency interface, the third radio frequency interface and the fourth radio frequency interface,
wherein the third radio frequency interface of a first frontend module is coupled with the fourth radio frequency interface of a second frontend module.

2. The frontend of claim 1, wherein each respective signal distribution device of the at least two frontend modules is adapted to:
provide a signal received by the first radio frequency interface to at least one of the second radio frequency interface and the third radio frequency interface,
provide a signal received by the fourth radio frequency interface to at least one of the second radio frequency interface and the third radio frequency interface,
provide a signal received by the second radio frequency interface to at least one of the first radio frequency interface and the fourth radio frequency interface, and
provide a signal received by the third radio frequency interface to at least one of the first radio frequency interface and the fourth radio frequency interface.

3. The frontend of claim 1, wherein at least one second radio frequency interface comprises a bidirectional external terminal adapted to receive radio frequency signals from the device under test and to provide radio frequency signals to the device under test.

4. The frontend of claim 3, wherein at least one second radio frequency interface comprises a circulator.

5. The frontend of claim 4, wherein the circulator comprises an external port, a first internal port and second internal port, the circulator is adapted to provide radio frequency signals received from the signal distribution module on a first internal port to the bidirectional external terminal, and to provide radio frequency signals received on the bidirectional external terminal to a second internal port.

6. The frontend of claim 1, wherein at least one second radio frequency interface comprises an external input terminal adapted to receive signals from the device under test.

7. The frontend of claim 1, wherein at least one second radio frequency interface comprises an external output terminal adapted to provide signals to the device under test.

8. The frontend of claim 1, wherein each respective first radio frequency interface of each of the at least two frontend modules comprises at least two input terminals, wherein each input terminal being adapted to receive signals from a signal generator.

9. The frontend of claim 8, wherein each respective signal distribution device of each of the at least two frontend modules is adapted to separately provide each signal received by an input terminal of the first radio frequency interface to at least one second radio frequency interface and the third radio frequency interface.

10. The frontend of claim 1, wherein at least one signal distribution device comprises a combiner for combining signals received by the first radio frequency interface and the fourth radio frequency interface.

11. The frontend module of claim 1, wherein at least one signal distribution device comprises a splitter for splitting a signal received by the second radio frequency interface and for providing the split signal to the first radio frequency interface and the fourth radio frequency interface.

12. A radio-frequency test device, the device comprising:
a signal generator;
a receiving device;
a frontend for a radio frequency test device, the frontend comprising at least two frontend modules, each frontend comprising:
a first radio frequency interface adapted to connect each respective frontend with at least one of the signal generator and the receiving device;
a second radio frequency interface adapted to connect each respective frontend with a device under test;
a third radio frequency interface adapted to connect each respective frontend with a first further frontend;
a fourth radio frequency interface adapted to connect each respective frontend with a second further frontend; and
a signal distribution device adapted to selectively couple the first radio frequency interface, the second radio frequency interface, the third radio frequency interface and the fourth radio frequency interface;
wherein the third radio frequency interface of a first frontend of the at least two frontend modules is coupled with the fourth radio frequency interface of a second frontend of the at least two frontend modules;

wherein the signal generator is adapted to provide radio frequency signals to the first radio frequency interface of the frontend modules; and wherein the receiving device is adapted to receive radio frequency signals provided by the first radio frequency interface of the frontend modules.

13. The radio frequency test device of claim 12, further comprising a radio frequency splitter adapted to split a radio frequency signal provided by the device under test and to provide the split radio frequency signal to second radio frequency interfaces of at least two frontend modules.

14. The radio frequency test device of claim 12, further comprising a radio frequency combiner adapted to combine radio frequency signals provided by second radio frequency interfaces of at least two second frontend modules and to provide the combined radio frequency signals to a device under test.

* * * * *